US009997254B2

(12) United States Patent
Vilas Boas et al.

(10) Patent No.: US 9,997,254 B2
(45) Date of Patent: Jun. 12, 2018

(54) SAMPLE-AND-HOLD CIRCUIT

(71) Applicant: Freescale Semiconductor, Inc., Austin, TX (US)

(72) Inventors: André Luis Vilas Boas, Amparo (BR); Richard Titov Lara Saez, Campinas (BR); Javier Mauricio Olarte Gonzalez, Campinas (BR)

(73) Assignee: NXP USA, INC., Austin, TX (US)

( * ) Notice: Subject to any disclaimer, the term of this patent is extended or adjusted under 35 U.S.C. 154(b) by 58 days.

(21) Appl. No.: 15/209,573

(22) Filed: Jul. 13, 2016

(65) Prior Publication Data

US 2018/0019020 A1 Jan. 18, 2018

(51) Int. Cl.

*G11C 27/02* (2006.01)
*H03K 5/00* (2006.01)
*H03K 17/00* (2006.01)
*G05F 3/24* (2006.01)

(52) U.S. Cl.

CPC .............. *G11C 27/024* (2013.01); *G05F 3/24* (2013.01)

(58) Field of Classification Search

CPC ..... G11C 27/026; G11C 27/024; G11C 27/02; G11C 27/00; H03K 5/249
USPC ..................................................... 327/91–97
See application file for complete search history.

(56) References Cited

U.S. PATENT DOCUMENTS 3,778,725 A 12/1973 Spaargaren
4,399,474 A 8/1983 Coleman, Jr.
4,544,854 A 10/1985 Ulmer et al.
4,973,975 A 11/1990 Yamazaki
5,517,141 A 5/1996 Adbi
5,684,425 A 11/1997 Nicollini et al.
5,703,506 A 12/1997 Shook et al.
6,215,335 B1 4/2001 Rabii
6,275,178 B1 8/2001 Koifman et al.
6,346,851 B1 * 2/2002 Zhang ................. H03H 11/245 327/336
6,774,617 B2 8/2004 Andoh
7,436,221 B2 10/2008 O'Halloran et al.
7,495,479 B1 2/2009 Hsu et al.
7,812,646 B2 10/2010 Augustyniak et al.
7,956,652 B2 6/2011 Tomisato
(Continued)

FOREIGN PATENT DOCUMENTS

EP 2650881 A1 10/2013

OTHER PUBLICATIONS

Mansano, A., "Power Management Controller for Automotive MCU Applications in 90nm CMOS Technology", IEEE 2011.
(Continued)

*Primary Examiner* — Quan Tra

(57) ABSTRACT

A sample-and-hold circuit, which includes a hold capacitor at its output terminal and at least one intermediate capacitor, intermittently receives an input voltage, and a first value of a switch enable signal causes the sample-and-hold circuit to sample the input voltage and to charge the at least one intermediate capacitor and the hold capacitor to the input voltage, and when it is not receiving the input voltage, a second value of the switch enable signal causes the sample-and-hold circuit to hold, at its output terminal, the input voltage until the hold capacitor discharges, which starts to discharge only after the at least one intermediate capacitor has substantially discharged.

20 Claims, 3 Drawing Sheets

(56) References Cited

U.S. PATENT DOCUMENTS

| | | | | |
|---|---|---|---|---|
| 8,547,270 | B1 | 10/2013 | Strode | |
| 8,890,577 | B1 | 11/2014 | Trampitsch | |
| 9,158,320 | B1* | 10/2015 | Shrivastava | G05F 1/468 |
| 2013/0271185 | A1* | 10/2013 | Landoulsi | H03K 17/16<br>327/93 |
| 2014/0145691 | A1* | 5/2014 | Nagda | G05F 1/46<br>323/271 |
| 2014/0362957 | A1* | 12/2014 | Morishita | H03D 7/125<br>375/347 |
| 2016/0056763 | A1 | 2/2016 | Zhao | |
| 2016/0104543 | A1 | 4/2016 | Powell et al. | |

OTHER PUBLICATIONS

Non-final office action dated Nov. 17, 2017 in U.S. Appl. No. 15/365,041.

Notice of Allowance dated Mar. 28, 2018 in U.S. Appl. No. 15/365,041.

* cited by examiner

300

400

500

600

SAMPLE-AND-HOLD CIRCUIT

BACKGROUND

Field

This invention relates generally to electronic circuits, and more specifically to power management controllers.

Related Art

When a Power Management Controller (PMC) of a System on a Chip (SoC) is operating in a low power mode, most of its circuits are off most of the time to reduce power consumption. A PMC may include a portion that provides a reference voltage. The reference voltage should be precise even when the PMC is operating in the low power mode.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
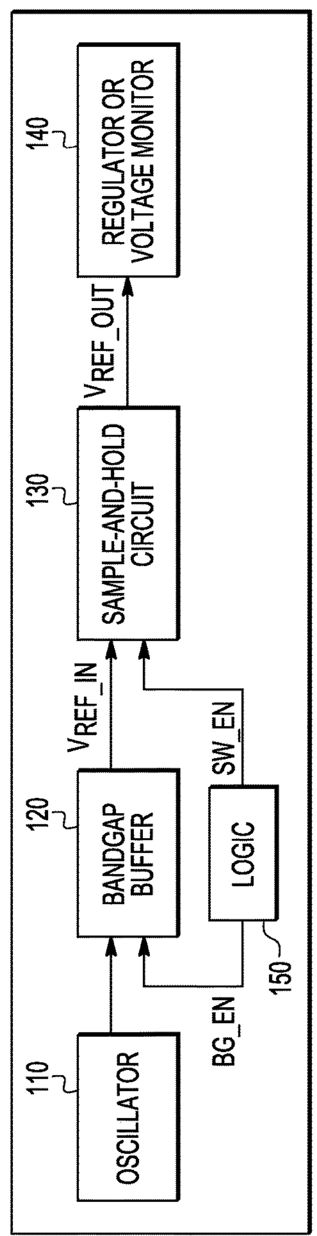
FIG. 1 is a functional block diagram of a portion of a typical PMC.

FIG. 1 is a functional block diagram of a portion of a typical PMC 100, which portion includes circuits that provide a reference voltage. The circuits that provide the reference voltage include an oscillator 110 and a bandgap buffer 120, and, if the PMC 100 has a low power mode, may also include a sample-and-hold circuit 130 for sampling and storing the reference voltage, and further include logic 150. The oscillator 110 outputs a signal to the bandgap buffer 120. The bandgap buffer 120 outputs a reference voltage $V_{REF\_IN}$ to the sample-and-hold circuit 130. The sample-and-hold circuit 130 outputs a $V_{REF\_OUT}$ signal to a functional analog block 140 that can be a regulator, a voltage monitor, or any other analog circuit. The logic 150 outputs a bandgap buffer enable signal BG_EN and a switch enable signal SW_EN to the bandgap buffer 120 and to the sample-and-hold circuit 130, respectively. When the PMC 100 is operating in a low power mode, the oscillator 110 typically remains on because the oscillator consumes a relatively small amount of power. When the PMC 100 is operating in a low power mode, the bandgap buffer 120 is off most of the time to reduce power consumption. This is because the bandgap buffer 120 consumes a relatively large amount of power. When the bandgap buffer 120 is off, the sample-and-hold circuit 130 should maintain $V_{REF\_OUT}$ at or near the reference voltage.

Figure 2:
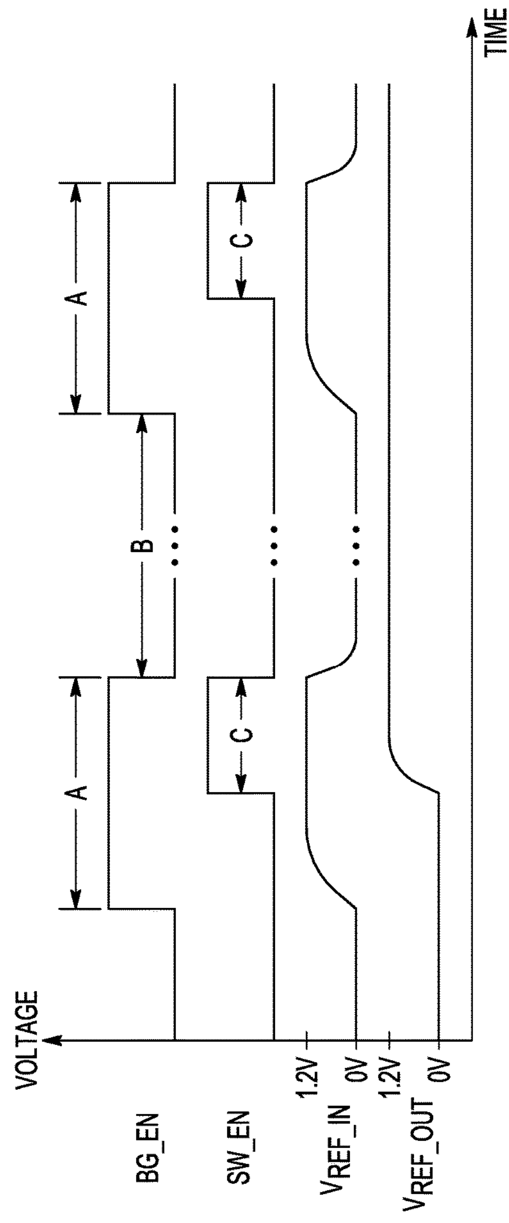
FIG. 2 is a graph of a set of signals in the portion of the typical PMC of FIG. 1.

FIG. 2 is a graph of a set of signals that may be present in the portion of the typical PMC 100 that provides the reference voltage. The bandgap buffer enable signal BG_EN and the switch enable signal SW_EN are digital signals that are either high or low. The signals $V_{REF\_IN}$ and $V_{REF\_OUT}$ are analog signals. FIG. 2 suggests that a typical reference voltage is 1.2V; however, other values for the reference voltage are possible. The logic 150 in the PMC 100 periodically turns on the bandgap buffer 120 for an interval "A". The interval "A" typically ranges from 10 μs to 40 μs. When the bandgap buffer 120 is on, it outputs the reference voltage so that the sample-and-hold circuit 130 can be refreshed during each interval "A". Interval "B" is an interval between successive intervals "A". The length of interval "B" of the sample-and-hold circuit 130 is inversely proportional to the overall power consumption of the PMC 100. The interval "B" typically ranges from 2 ms to 100 ms.

The overall power consumption of the bandgap buffer 120 when the PMC 100 is operating in a low power mode can be estimated by multiplying the power consumption of the bandgap buffer when it is on by number of microseconds that it is on, and then taking into account number of milliseconds that the bandgap buffer is off.

Figure 3:
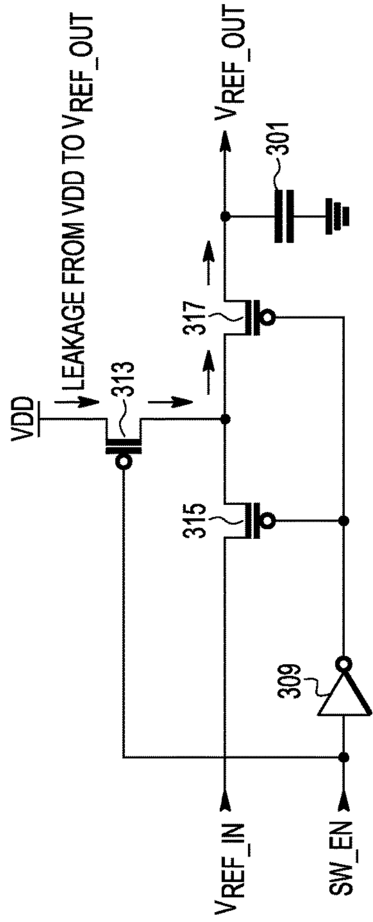
FIG. 3 is a schematic of a known sample-and-hold circuit.

FIG. 3 is a schematic of a known sample-and-hold circuit 300 of the typical PMC 100. The known sample-and-hold circuit 300 includes a capacitor 301. Typically, the capacitor 301 has a value of 10 μF. The known sample-and-hold circuit 300 includes an inverter 309 and one or more transistors 313, 315 and 317. The logic 150 of the typical PMC 100 causes the SW_EN signal to go high during each interval "C". When the SW_EN signal is high, transistor 313 is off and transistors 315 and 317 are on. When transistors 315 and 317 are on, capacitor 301 is re-charged such that a voltage across the capacitor 301 is the reference voltage. The logic 150 causes the BG_EN signal and the SW_EN signal to go low at the same time. The SW_EN signal going low causes the transistors 315 and 317 to turn off. Transistor 313 is used to reduce leakage in transistor 315 and transistor 317; however, leakage nevertheless occurs at transistor 315 and transistor 317. By "leakage" it is meant a current between drain and source terminals of a transistor when the transistor is normally considered to be not conducting. When the transistors 315 and 317 are off, leakage current through transistors 315 and 317 disturbs the charge (and voltage) stored in the capacitor 301, especially at temperatures above approximately 125° C. When the bandgap buffer 120 is off, the sample-and-hold circuit 130 is able to maintain at its output terminal, for a limited amount of time, a voltage at or near the reference voltage due to the presence of capacitor 301. The longer capacitor 301 can maintain its voltage the longer is the refresh period "B" of the known sample-and-hold circuit 300, and, as a result, the lower is the overall consumption of the PMC 100. The refresh period "B" of the known sample-and-hold circuit 300 is 2 ms to 100 ms, depending on a size of the capacitor 301, supply voltage and temperature. However, with the known sample-and-hold circuit 300, a longer refresh period "B" requires a larger capacitor 301, but a larger capacitor requires more area which is disadvantageous. The known sample-and-hold circuit 300 is disadvantageous because the refresh period "B", which is when the bandgap buffer 120 is off, is relatively short for a given value of the capacitor 301. As a result, the typical PMC 100 that includes the known sample-and-hold circuit 300 may consume an undesirable amount of power when the typical PMC is in the low power mode. This is because the known sample-and-hold circuit 300 may consume an undesirable amount of power when the typical PMC 100 is in the low power mode. The known sample-and-hold circuit 300 may consume an undesirable amount of power when the typical PMC 100 is in the low power mode because the known sample-and-hold circuit must be turned on often.

As the geometry of the fabrication process by which the known sample-and-hold circuit 300 is constructed becomes smaller, the leakage current through transistors 313, 315 and 317 increases. To compensate for such increase in leakage, the size of capacitor 301 can be increased which is disadvantageous, or a frequency of refresh of capacitor 301 can be increased which is also disadvantageous, or both the size and the frequency can be increased. When the known sample-and-hold circuit 300 is fabricated using bulk technology, there is a parasitic reverse diode (not shown) across the terminals of transistor 317. The parasitic reverse diode starts to conduct current at high temperatures which causes capacitor 301 to either discharge to ground or to charge to $V_{DD}$, depending on the polarity of transistor 317. As result of a drain-to-source voltage difference in the transistors of the known sample-and-hold circuit 300, leakage readily occurs, especially at high temperatures. When the known sample-and-hold circuit 300 is fabricated using fully depleted silicon-on-insulator (FD-SOI) technology, such parasitic reverse diode is not present; however, the known sample-and-hold circuit still may exhibit excessive leakage due to unwanted conduction across transistor 315 and transistor 317 depending on a size, or channel length, of transistor 315 and transistor 317. For example, when transistor 317 is off, transistor 317 acts as a very large, but not infinite, resistance. As a result, a small current flows from the $V_{DD}$ terminal to capacitor 301, and $V_{REF\_OUT}$ slowly ramps up until transistor 317 is turned on to refresh $V_{REF\_OUT}$ to the reference voltage. A similar, but opposite, effect occurs if transistor 313 is connected to the ground terminal instead of $V_{DD}$ terminal. In an attempt to reduce such leakage, the known sample-and-hold circuit 300 uses long channel, or larger, transistors. For example, the width-to-length ratio of the channel of the transistors used in the known sample-and-hold circuit 300 is 0.2 μm/5 μm.

In another known sample-and-hold circuit, a switch is split into series switches, and an intermediate node is biased to the output voltage. The biasing of the intermediate node is accomplished using a voltage buffer that uses, as its input, an output voltage of the known sample-and-hold circuit. Disadvantageously, use of a buffer to bias the intermediate node increases consumption, die area and circuit complexity.

In yet known sample-and-hold circuit, a switch is split into series switches, and an intermediate node is biased to a copy of the output, scaled down by a resistor branch. Disadvantageously, this known circuit requires a power-consuming resistor branch (a resistor divider) to generate the bias voltage for the intermediate node of the switch, which limits its application because this known circuit is only worthwhile when an amplifier and a resistor branch already exist; if they do not already exist the area and/or power consumption increases.

In still another known sample-and-hold circuit, a switch is split into series switches, and the intermediate node is biased to a fixed reference voltage which generates a reduction in the leakage that depends on a value of the charge stored in the capacitor. However, the use of a continuous fixed reference voltage requires a circuit that is always consuming power, which increases consumption and complexity.

In a further known sample-and-hold circuit, a switch is split into series switches and an intermediate node is biased by a voltage through the use of another switch. The bias voltage must be generated from a buffer or through a resistor divider both of which disadvantageously use more power.

Figure 4:
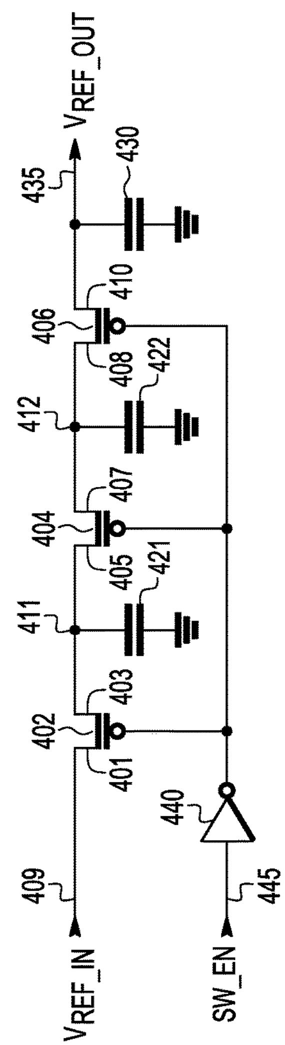
FIG. 4 is a simplified schematic of one embodiment of a sample-and-hold circuit in accordance with the invention.

FIG. 4 is a simplified schematic of one embodiment of a sample-and-hold circuit 400 in accordance with the invention. The sample-and-hold circuit 400 samples and stores an input voltage. In one embodiment, the input voltage is a reference voltage. In one embodiment, the reference voltage is a bandgap voltage. In one embodiment the bandgap voltage is 1.2V. The sample-and-hold circuit 400 is coupled to a bandgap buffer 120 that consumes about 100 μA when it is on. The bandgap buffer 120 is coupled to a low frequency (about 10 Hz) oscillator 110 that consumes about 25 nA when it is on.

Referring again to FIG. 2, with the sample-and-hold circuit 400, the number of milliseconds that the bandgap buffer 120 is off is approximately 1100 ms, i.e., the interval "B" is 1100 ms, whereas with the known sample-and-hold circuit 300, the number of milliseconds that the bandgap buffer 120 is off is approximately 13 ms, considering a reference voltage of 1.2V, a same temperature, and a same amount of voltage degradation at the $V_{REF\_OUT}$ terminal of each circuit.

In one embodiment, the sample-and-hold circuit 400 is used in a voltage reference portion of a PMC such as the typical PMC 100. The voltage reference should remain precise even when the PMC is operating in low power mode. The sample-and-hold circuit 400 in accordance with the invention allows a precise voltage reference to be continuously available when the PMC is operating in the low power mode. The sample-and-hold circuit 400 may provide a voltage reference for an analog circuit such as a regulator or a voltage monitor.

From one perspective, the sample-and-hold circuit 400 consumes less power to maintain the $V_{REF\_OUT}$ constant than does the known sample-and-hold circuit 300, while using a same total capacitance. From another perspective, the sample-and-hold circuit 400 allows for use of a smaller total capacitance, while consuming the same power as does the known sample-and-hold circuit 300, to maintain the $V_{REF\_OUT}$ constant.

Unlike the known sample-and-hold circuit 300, the sample-and-hold circuit 400 in accordance with the invention does not need to use long channel length transistors. The sample-and-hold circuit 400 can advantageously use transistors of almost minimum channel length because the drain-to-source voltage difference of its transistors remains small for longer periods of time. In one embodiment, the channel of transistors 402, 404 and 406 have a width-to-length ratio of 0.2 μm/0.25 μm. Therefore, transistors 402, 404 and 406 do not have long channel lengths. More specifically, transistors 402, 404 and 406 have a smaller drain-to-source voltage difference than transistors 315 and 317 of the known sample-and-hold circuit 300 for a same period of time.

With the sample-and-hold circuit 400, there is, advantageously, minimal current flowing into or out of the hold capacitor 430 during interval "B". As a result, during interval "B", the sample-and-hold circuit 400 holds $V_{REF\_OUT}$ nearly constant.

The sample-and-hold circuit 400 allows the number of milliseconds that the bandgap buffer 120 is off to be advantageously increased (compared to the known sample-and-hold circuit 300) while the number of microseconds that the bandgap buffer is on remains unchanged (compared to the known sample-and-hold circuit 300).

With the sample-and-hold circuit 400, the number of milliseconds that the SW_EN signal is low is also increased to match the number of milliseconds that the bandgap buffer 120 is off. The SW_EN signal goes high sometime after the bandgap buffer 120 is turned on to assure that the bandgap buffer 120 is fully awake and has entered a stable state when the SW_EN signal is high.

The sample-and-hold circuit 400 includes transistors 402, 404 and 406. A first conducting terminal 401 of transistor 402 is coupled to an input terminal 409 of the sample-and-hold circuit 400. A second conducting terminal 403 of transistor 402 is coupled to a first node 411. A first intermediate capacitor 421 is coupled between the first node 411 and a ground terminal A first conducting terminal 405 of transistor 404 is coupled to the first node 411. A second conducting terminal 407 of transistor 404 is coupled to a second node 412. A second intermediate capacitor 422 is coupled between the second node 412 and the ground terminal A first conducting terminal 408 of transistor 406 is coupled to the second node 412. A second conducting terminal 410 of transistor 406 is coupled to an output terminal 435 of the sample-and-hold circuit 400. A hold capacitor 430 is coupled between the output terminal 435 of the sample-and-hold circuit 400 and ground. In one embodiment, the capacitance of the first intermediate capacitor 421 is one-tenth the capacitance of the hold capacitor 430, and the capacitance of the second intermediate capacitor 422 is also one-tenth the capacitance of the hold capacitor.

Transistors 402, 404 and 406 function as switches. These switches are closed when these transistors are on. In the illustrated embodiment, transistors 402, 404 and 406 are PMOS transistors. The control terminal of transistors 402, 404 and 406 is coupled to a switch enable terminal 445 of the sample-and-hold circuit 400 through an inverter 440. In another embodiment (not shown), transistors 402, 404 and 406 are NMOS transistors, and, in such embodiment, the inverter 440 is not included in the circuit and the control terminal of transistors 402, 404 and 406 is coupled directly to the switch enable terminal 445. Transistors 402, 404 and 406 are turned on and off simultaneously by the SW_EN signal. When transistors 402, 404 and 406 are on, a voltage at the first node 411 and the second node 412 is $V_{REF\_IN}$. When transistors 402, 404 and 406 are on, and the first intermediate capacitor 421, the second intermediate capacitor 422 and the hold capacitor 430 are charged to $V_{REF\_IN}$. The configuration of the sample-and-hold circuit 400 allows $V_{DS}$ of transistors 402, 404 and 406 to remain near 0V for as long as possible. More specifically, the presence of the first intermediate capacitor 421 and the second intermediate capacitor 422 in the sample-and-hold circuit 400 allows $V_{DS}$ of transistors 402, 404 and 406 to remain near 0V for longer than $V_{DS}$ of corresponding transistors in the known sample-and-hold circuit 300.

When the bandgap buffer 120 is on, the reference voltage is present at the output of the bandgap buffer 120. When the bandgap buffer 120 is off, the output of the bandgap buffer 120 is grounded. When the BG_EN signal is high the bandgap buffer 120 is on, and the output of the bandgap buffer 120 is the reference voltage. When the output of the bandgap buffer 120 is the reference voltage and the SW_EN signal is high, the sample-and-hold circuit 400 is refreshed, and the voltage at the first node 411, at the second node 412 and at the output terminal 435 of the sample-and-hold circuit are initially at the reference voltage. When the bandgap buffer 120 is turned off, the voltage $V_{REF\_IN}$ goes to 0V. The logic 150 causes the SW_EN signal to go low at the same time that the logic causes the BG_EN signal to go low.

However, the voltage at the first intermediate node 411 remains at $V_{REF\_IN}$ for a while. As a result of 0V being present at the first conducting terminal 401 of transistor 402 while a higher voltage (initially $V_{REF\_IN}$) is at the second conducting terminal 403 of transistor 402 there is a voltage $V_{DS}$ across transistor 402. As a result of the voltage $V_{DS}$ across transistor 402, current flows through transistor 402 in spite of it being off. This current discharges the first intermediate capacitor 421, and, as a result, the voltage at the first intermediate node 411 goes down from its initial value of $V_{REF\_IN}$. This current flows through transistor 402 to a ground terminal within the bandgap buffer 120.

Because the voltage at the first intermediate node 411 is decreasing, the voltage at the first conducting terminal 405 of transistor 404 decreases from its initial value of $V_{REF\_IN}$. As a result of the voltage at the first conducting terminal 405 of transistor 404 being less than $V_{REF\_IN}$ while the voltage at the second conducting terminal 407 of transistor 404 is higher (initially $V_{REF\_IN}$), there is an increasing voltage $V_{DS}$ across transistor 404. As a result of the voltage $V_{DS}$ across transistor 404, a current flows through transistor 404 in spite of transistor 404 being off. This current discharges the second intermediate capacitor 422, and, as a result, the voltage at the second intermediate node 412 goes down from its initial value of $V_{REF\_IN}$.

Because the voltage at the second intermediate node 412 is decreasing, the voltage at the first conducting terminal 408 of transistor 406 decreases from its initial value of $V_{REF\_IN}$. As a result of the voltage at the first conducting terminal 408 of transistor 406 being less than $V_{REF\_IN}$ while the voltage at the second conducting terminal 410 of transistor 406 is higher (initially $V_{REF\_IN}$), there is a voltage $V_{DS}$ across transistor 406. As a result of the voltage $V_{DS}$ across transistor 406, current flows through transistor 406 in spite of transistor 406 being off. This current discharges the hold capacitor 430, and, as a result, the voltage at the output of the known sample-and-hold circuit 400 goes down from its initial value of $V_{REF\_IN}$. Eventually, the voltage $V_{REF\_OUT}$ at the output of the sample-and-hold circuit 400 may go to 0V unless the sample-and-hold circuit 400 is refreshed. Advantageously, the sample-and-hold circuit 400 maintains the $V_{DS}$ of transistor 406 closer to 0V for a longer period than the known sample-and-hold circuit 300 maintains $V_{DS}$ of its corresponding transistor 317. The hold capacitor 430 starts to discharge only after the second intermediate capacitor 422 has been discharging for a while. Furthermore, the second intermediate capacitor 422 starts to only after the first intermediate capacitor 421 has been discharging for a while. Note that the first intermediate capacitor 421 and the second intermediate capacitor 422 may be smaller than the hold capacitor 430, and, therefore, individually discharge faster than the hold capacitor 430 discharges. However, the presence of the first intermediate capacitor 421 and the second intermediate capacitor 422 nevertheless substantially delays discharge of the hold capacitor 430. As a result of the presence of the first intermediate capacitor 421 and the second intermediate capacitor 422, the output voltage $V_{REF\_OUT}$ of the sample-and-hold circuit 400 is maintained at or near $V_{REF\_IN}$ for a longer time than with the known sample-and-hold circuit 300.

In another embodiment (not shown), the sample-and-hold circuit 400 does not include transistor 404, the second intermediate node 412 and the second intermediate capacitor 422.

Figure 5:
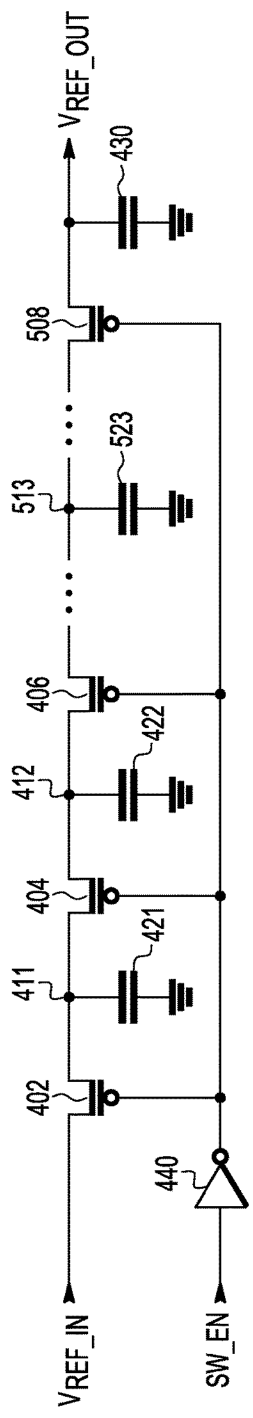
FIG. 5 is a simplified schematic of another embodiment of a sample-and-hold circuit in accordance with the invention.

FIG. 5 is a simplified schematic of a multiple-stage implementation of a sample-and-hold circuit 500. Compared to the sample-and-hold circuit 400, the sample-and-hold circuit 500 includes one or more additional transistors, and a corresponding number of additional intermediate capacitors coupled between a corresponding number of additional intermediate nodes and ground. In the illustrated embodiment, one additional transistor 508 is added, one additional node 513 is defined and one additional intermediate capacitor 523 is added. An advantage of the multiple-stage implementation of the sample-and-hold circuit 500 is the reduction of leakage.

The sample-and-hold circuits 400 and 500, which are constructed using PMOS transistors, function well provided that the reference voltage is not near ground. However, if the reference voltage were near ground, it may be difficult to turn on the PMOS transistors when trying to refresh hold capacitor 430. In such case, the sample-and-hold circuits 400 and 500 can be constructed using NMOS transistors instead of using PMOS transistors. Embodiments of the sample-and-hold circuits 400 and 500 constructed using NMOS transistors function well provided that the reference voltage is not near $V_{DD}$. However, if the reference voltage were near $V_{DD}$, it may be difficult to turn on the NMOS transistors when trying to refresh hold capacitor 430.

Figure 6:
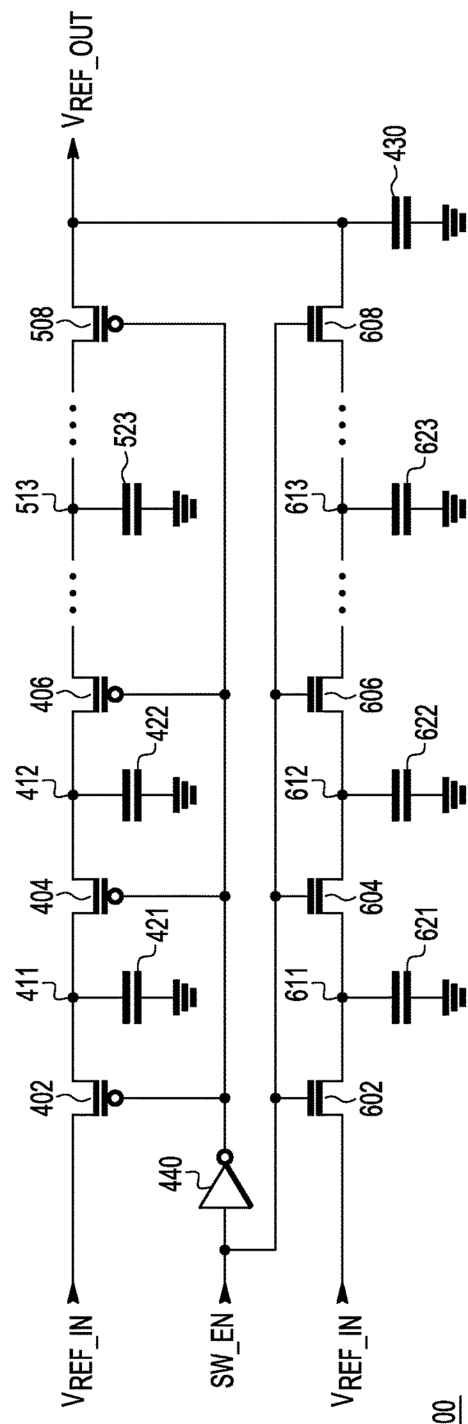
FIG. 6 is a simplified schematic of still another embodiment of a sample-and-hold circuit in accordance with the invention.

If the range of the reference voltage is uncertain, i.e., it is not known whether is the reference voltage near ground or near $V_{DD}$, then the sample-and-hold circuit 600 shown in FIG. 6 functions well. With the sample-and-hold circuit 600, one of the set of PMOS transistors and the set of NMOS transistors turns on regardless of whether the reference voltage is near $V_{DD}$ or near ground. The NMOS transistors and the capacitors coupled to them in FIG. 6 are configured analogously to the way in which the PMOS transistors and the capacitors coupled to them are configured in FIG. 4 and FIG. 5; therefore, there is no need to describe their configuration in detail. FIG. 6 shows that each transistor of the sample-and-hold circuit 500 can be replaced with a transmission gate.

The sample-and-hold circuit 400 includes very low leakage switches (transistors 402, 404 and 406) capable of a holding a sampled voltage for a longer period than can the known sample-and-hold circuit 300. Advantageously, the switches (transistors 402, 404 and 406) can be built without using long channel devices. When the switches are built without using long channel devices settling time is improved. Because there is no device connecting $V_{DD}$ to the first intermediate node 411 or to the second intermediate node 412, the leakage between the input terminal 409 and the output terminal 435 of the sample-and-hold circuit 400 is highly reduced.

Leakage caused by a voltage difference between a drain terminal and a source terminal in a CMOS transistor operating as a switch is substantially reduced using at least one intermediate capacitor (such as first intermediate capacitor 421) connected to a respective at least one intermediate node, without the need of a buffer.

Advantageously, the reference voltage outputted by the sample-and-hold circuit 400, 500 and 600 is precise even when the PMC 100 is operating in the low power mode.

As interval "B" (see FIG. 2) is doubled, power consumption of the portion of the PMC 100 that provides the reference voltage is approximately divided by two, disregarding circuits, such as the oscillator 110, that are always enabled.

In one embodiment, the circuit in accordance with the invention is fabricated using FD-SOI technology. With FD-SOI technology, there are parasitic diodes at the terminals of transistors 402, 404 and 406 that tend to discharge the hold capacitor 430.

A low power consumption bandgap buffer is typically less precise that a high power consumption bandgap buffer. The sample-and-hold circuit 400 is particularly advantageous when used in a PMC that lacks a low power consumption bandgap buffer and has only a high power consumption bandgap buffer such as a bandgap buffer that consumes 100 μA.

The sample-and-hold circuit 400 uses approximately the same amount of capacitance (die area) that is used by the known sample-and-hold circuit 300 but distributed in a different manner. For example, the value of capacitor 301 of the known sample-and-hold circuit 300 is 10 ρF. In one embodiment of the sample-and-hold circuit 400 in accordance with the invention, the value of hold capacitor 430 is 8 ρF, the value of first intermediate capacitor 421 is 0.8 ρF and the value of second intermediate capacitor 422 is 0.8 ρF. Consequently, the total capacitance of the capacitors used in the sample-and-hold circuit 400 in accordance with the invention is advantageously approximately the same as the total capacitance of the capacitor used in the known sample-and-hold circuit 300.

The term "coupled", as used herein, is defined as "connected", and encompasses the coupling of devices that may be physically, electrically or communicatively connected, although the coupling may not necessarily be directly, and not necessarily be mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The term "coupled", as used herein, is not intended to be limited to a direct coupling or a mechanical coupling, and that one or more additional elements may be interposed between two elements that are coupled. It is understood that the terms so used are interchangeable under appropriate circumstances such that the embodiments of the invention described herein are, for example, capable of operation in other orientations than those illustrated or otherwise described herein.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. A sample-and-hold circuit comprising:

a switch enable terminal for receiving a switch enable signal;

an input terminal for intermittently receiving an input voltage;

a first transistor having one conducting terminal coupled to the input terminal, having another conducting terminal coupled to a node and having a control terminal coupled to the switch enable terminal;

an intermediate capacitor coupled between the node and a ground terminal;

a second transistor having one conducting terminal coupled to a second node, having another conducting terminal coupled to an output terminal and having a control terminal coupled to the switch enable terminal; and a hold capacitor coupled between the output terminal and the ground terminal;

a third transistor having one conducting terminal coupled to the node, having another conducting terminal coupled to the second node and having a control terminal coupled to the switch enable terminal;

a second capacitor coupled between the second node and the ground terminal;

a path between the input terminal and the output terminal, the path including the first transistor, the node, the third transistor, the second node, and the second transistor;

wherein, when the input terminal is receiving the input voltage, a first value of the switch enable signal causes the sample-and-hold circuit to sample the input voltage and to charge the intermediate capacitor, the second capacitor, and the hold capacitor to the sampled input voltage, wherein, when the input terminal is not receiving the input voltage, a second value of the switch enable signal causes the sample-and-hold circuit to hold, at the output terminal, the sampled input voltage until the hold capacitor discharges, and wherein the charge on the intermediate capacitor and the second capacitor delays discharging of the hold capacitor.

2. The sample-and-hold circuit of claim 1, wherein when the input terminal is receiving the input voltage, the first value of the switch enable signal causes the first transistor, the third transistor, and the second transistor to conduct thereby charging the intermediate capacitor, the second capacitor, and the hold capacitor to the sampled input voltage.

3. The sample-and-hold circuit of claim 1, wherein the second value of the switch enable signal causes the first transistor, the third transistor, and the second transistor to not conduct except for leakage current.

4. The sample-and-hold circuit of claim 3, wherein, when the input terminal is not receiving the input voltage, the input terminal is coupled to ground potential.

5. The sample-and-hold circuit of claim 4, wherein, the leakage current causes the charge on the hold capacitor to start discharging only after the intermediate capacitor and the second transistor have substantially discharged.

6. The sample-and-hold circuit of claim 1, wherein, the input voltage is a bandgap reference voltage.

7. A power management controller comprising:

a bandgap buffer configured to intermittently output a reference voltage;

a sample-and-hold circuit coupled to the bandgap buffer; and logic configured to output a bandgap buffer enable signal to the bandgap buffer and to output a switch enable signal to the sample-and-hold circuit, wherein the sample-and-hold circuit includes:

a switch enable terminal configured to receive the switch enable signal;

an input terminal configured to receive the reference voltage;

a first transistor having one conducting terminal coupled to the input terminal, another conducting terminal coupled to a node and a control terminal coupled to the switch enable terminal;

an intermediate capacitor coupled between the node and a ground terminal;

a second transistor having one conducting terminal coupled to a second node, another conducting terminal coupled to an output terminal and a control terminal coupled to the switch enable terminal; and a hold capacitor coupled between the output terminal and the ground terminal;

a third transistor having one conducting terminal coupled to the node, having another conducting terminal coupled to the second node and having a control terminal coupled to the switch enable terminal;

a second capacitor coupled between the second node and the ground terminal;

a path between the input terminal and the output terminal, the path including the first transistor, the node, the third transistor, the second node, and the second transistor;

wherein, when the input terminal is receiving the reference voltage, a first value of the switch enable signal causes the sample-and-hold circuit to sample the reference voltage and to charge the intermediate capacitor, the second capacitor, and the hold capacitor to the reference voltage, wherein, when the input terminal is not receiving the reference voltage, a second value of the switch enable signal causes the sample-and-hold circuit to hold, at the output terminal, the reference voltage until the hold capacitor discharges, wherein the charge on the intermediate capacitor and the second capacitor delays discharging of the hold capacitor.

8. The power management controller of claim 7, including:

an oscillator coupled to the bandgap buffer.

9. The power management controller of claim 8, including:

a regulator coupled to the output terminal of the sample-and-hold circuit.

10. The power management controller of claim 8, including:

a voltage monitor coupled to the output terminal of the sample-and-hold circuit.

11. The power management controller of claim 7, wherein when the input terminal is receiving the reference voltage, the first value of the switch enable signal causes the first transistor, the third transistor, and the second transistor to conduct thereby charging the intermediate capacitor, the second capacitor, and the hold capacitor to the reference voltage.

12. The power management controller of claim 7, wherein the second value of the switch enable signal causes the first transistor, the third transistor, and the second transistor to not conduct except for leakage current.

13. The power management controller of claim 12, wherein, when the input terminal is not receiving the reference voltage, the input terminal is coupled to ground potential.

14. The power management controller of claim 13, wherein, the leakage current causes the charge on the hold capacitor to start discharging only after the intermediate capacitor and the second capacitor have substantially discharged.

15. A method with a sample-and-hold circuit having a switch enable terminal coupled to a control terminal of a first transistor, a control terminal of a second transistor and a control terminal of a third transistor, comprising:

for a first interval, receiving a reference voltage at an input terminal;

during at least some of the first interval, receiving a first value of a switch enable signal at the switch enable terminal, thereby:

turning on the first transistor which has one conducting terminal coupled to the input terminal and another conducting terminal coupled to a first node, charging a first intermediate capacitor coupled between the first node and ground, turning on the second transistor which has one conducting terminal coupled to the first node and another conducting terminal coupled to a second node, charging a second intermediate capacitor coupled between the second node and ground, turning on the third transistor which has one conducting terminal coupled to the second node and another conducting terminal coupled to an output terminal, and charging a hold capacitor coupled between the output terminal and ground, wherein a path from the input terminal to the output terminal includes the first transistor, the first node, the second transistor, the second node, and the third transistor; and during a second interval occurring immediately subsequent to the first interval, cease receiving the reference voltage, and begin receiving a second value of the switch enable signal, thereby:

turning off the first transistor, turning off the second transistor, and turning off the third transistor, wherein the charge on the second intermediate capacitor delays discharging of the hold capacitor when the input terminal is not receiving the reference voltage.

16. The method of claim 15, wherein, when the input terminal is not receiving the reference voltage, coupling the input terminal to ground potential.

17. The method of claim 15, wherein a charge on the first intermediate capacitor delays discharging of the second intermediate capacitor when the input terminal is not receiving the reference voltage.

18. The method of claim 15, wherein when the input terminal is receiving the reference voltage, the first value of the switch enable signal causes the first transistor, the second transistor and the third transistor to conduct thereby charging the first intermediate capacitor, the second intermediate capacitor and the hold capacitor to the reference voltage.

19. The method of claim 15, wherein the second value of the switch enable signal causes the first transistor, the second transistor and the third transistor to not conduct except for leakage current.

20. The method of claim 19, wherein, the leakage current causes the charge on the hold capacitor to start discharging only after the second intermediate capacitor has substantially discharged.

* * * * *